US008310509B2

(12) United States Patent
Law et al.

(10) Patent No.: US 8,310,509 B2
(45) Date of Patent: Nov. 13, 2012

(54) DIRECT DIGITAL MARKING SYSTEMS

(75) Inventors: Kock-Yee Law, Penfield, NY (US); Yuanjia Zhang, Rochester, NY (US); Mandakini Kanungo, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 281 days.

(21) Appl. No.: 12/869,605

(22) Filed: Aug. 26, 2010

(65) Prior Publication Data

US 2012/0052436 A1 Mar. 1, 2012

(51) Int. Cl.
*B41J 2/41* (2006.01)
*G03F 1/00* (2012.01)
*G03G 13/16* (2006.01)
*G03G 15/00* (2006.01)

(52) U.S. Cl. .......... 347/112; 430/7; 430/125.3; 399/159

(58) Field of Classification Search ........................ None
See application file for complete search history.

*Primary Examiner* — Stephen Meier
*Assistant Examiner* — Alexander C Witkowski
(74) *Attorney, Agent, or Firm* — MH2 Technology Law Group LLP

(57) ABSTRACT

Various embodiments provide systems and methods for direct digital marking, wherein an electrostatic latent image or a surface charge contrast can be formed and developed at a development nip formed by a nano-enabled imaging member and a negatively-biased development subsystem.

20 Claims, 7 Drawing Sheets

DIRECT DIGITAL MARKING SYSTEMS

RELATED APPLICATION

Reference is made to co-pending, commonly assigned U.S. patent application Ser. Nos. 12/539,397 and 12/539,557, both entitled "Digital Electrostatic Latent Image Generating Member" and filed Aug. 11, 2009, and U.S. patent application Ser. No. 12/854,526, entitled "Electrostatic Digital Offset/Flexo Printing," filed Aug. 11, 2010, the disclosures of which are incorporated herein by reference in their entirety.

DETAILED DESCRIPTION

1. Field of Use

The present teachings relate to xerographic printing and marking systems and, more particularly, to systems and methods of direct digital marking.

2. Background

Conventionally, there are two digital printing technology platforms, namely xerography and inkjet printing. Current xerographic printing involves multiple steps including charging of the photoreceptor and forming a latent image on the photoreceptor; developing the latent image; transferring and fusing the developed image onto a media; and erasing and cleaning the photoreceptor. Although xerographic printing is a mature technology, challenges remain in unit manufacturing cost (UMC) and run cost. Other than the digital input, the xerographic printing system is essentially an analog device.

Solid inkjet printing (SIJ) is another printing technology which is now serving the office color market and is working its way towards the production color market. However, there are many challenges to mastering SIJ including low unit UMC, high print quality, and wide media range with press-like reliability. The common issues for all these print platforms are that the print systems are very complex. The system complexity leads to complicated print processes, high UMC, and high run cost. Accordingly, there is a need for a print system that is simple, small, fast, green, smart, and low cost.

SUMMARY

According to various embodiments, the present teachings include a direct digital marking method. The marking method can use a nano-enabled imaging member that includes an array of hole-injecting pixels disposed over a substrate and a charge transport layer disposed over the array of hole-injecting pixels with each pixel of the array of hole-injecting pixels electrically isolated and individually addressable. A negatively-biased development subsystem can also be provided in proximity to the nano-enabled imaging member to form a development nip there-between. A surface charge contrast can then be generated at the development nip on a surface of the charge transport layer by selectively addressing one or more hole-injecting pixels of the array. The one or more selectively addressed pixels can inject holes at the interface of the one or more pixels and the charge transport layer, while the injected holes can be transported by the charge transport layer to the surface. The surface charge contrast can then be developed with a developing material at the development nip to form a developed image on the surface of the charge transport layer. The developed image can further be transferred from the charge transport layer onto a media.

According to various embodiments, the present teachings also include a direct digital marking system. The system can include a nano-enabled imaging member for forming an electrostatic latent image, the nano-enabled imaging member including an array of hole-injecting pixels disposed over a substrate and a charge transport layer disposed over the array of hole-injecting pixels with each hole-injecting pixel electrically isolated and individually addressable. In the system, a negatively-biased development subsystem can be placed in proximity to the nano-enabled imaging member to form a development nip there-between for developing the electrostatic latent image and forming a developed image within the development nip. A transfer subsystem can be configured for transferring the developed image onto a media.

According to various embodiments, the present teachings further include a method of printing an image onto a media. The method can use a nano-enabled imaging member that includes an array of hole-injecting pixels disposed over a substrate and a charge transport layer disposed over the array of hole-injecting pixels with each pixel of the array of hole-injecting pixels electrically isolated and individually addressable. A negatively-biased development subsystem with a magnetic brush can be provided in proximity to the nano-enabled imaging member to form a development nip there-between. An electrostatic latent image can then be generated at the development nip on a surface of the charge transport layer by selectively addressing one or more hole-injecting pixels of the array via the magnetic brush. The one or more selectively addressed pixels can inject holes at the interface of the one or more pixels and the charge transport layer. The injected holes can be transported by the charge transport layer to the surface. The electrostatic latent image can then be developed with a developing material at the development nip to form a developed visible image on the surface of the charge transport layer. The developed visible image can be transferred from the charge transport layer onto a media.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate embodiments of the present teachings and together with the description, serve to explain the principles of the present teachings.

DESCRIPTION OF THE EMBODIMENTS

Reference will now be made in detail to embodiments of the present teachings, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

Figure 1:
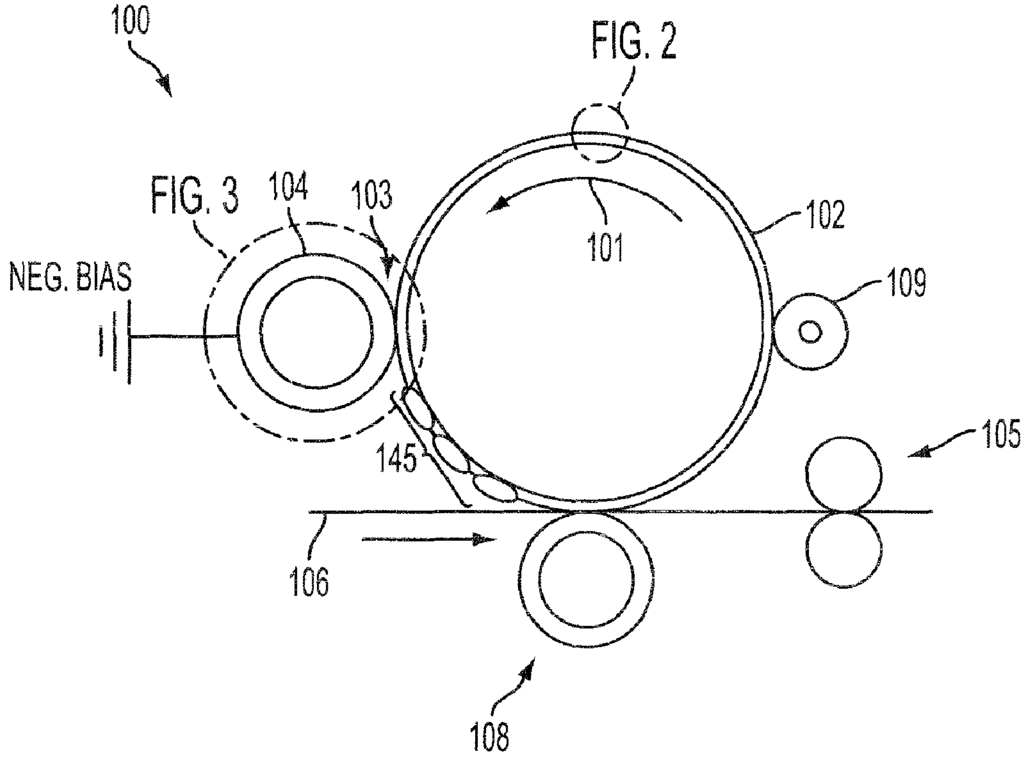
FIG. 1 schematically illustrates a portion of an exemplary direct digital marking system in accordance with various embodiments of the present teachings.

FIG. 1 schematically illustrates a portion of an exemplary direct digital marking system 100, according to various embodiments of the present teachings. The exemplary direct digital marking system 100 can include a nano-enabled imaging member 102 for forming an electrostatic latent image. The nano-enabled imaging member 102 can rotate in a direction 101.

Nano-Enabled Imaging Member

Figure 2:
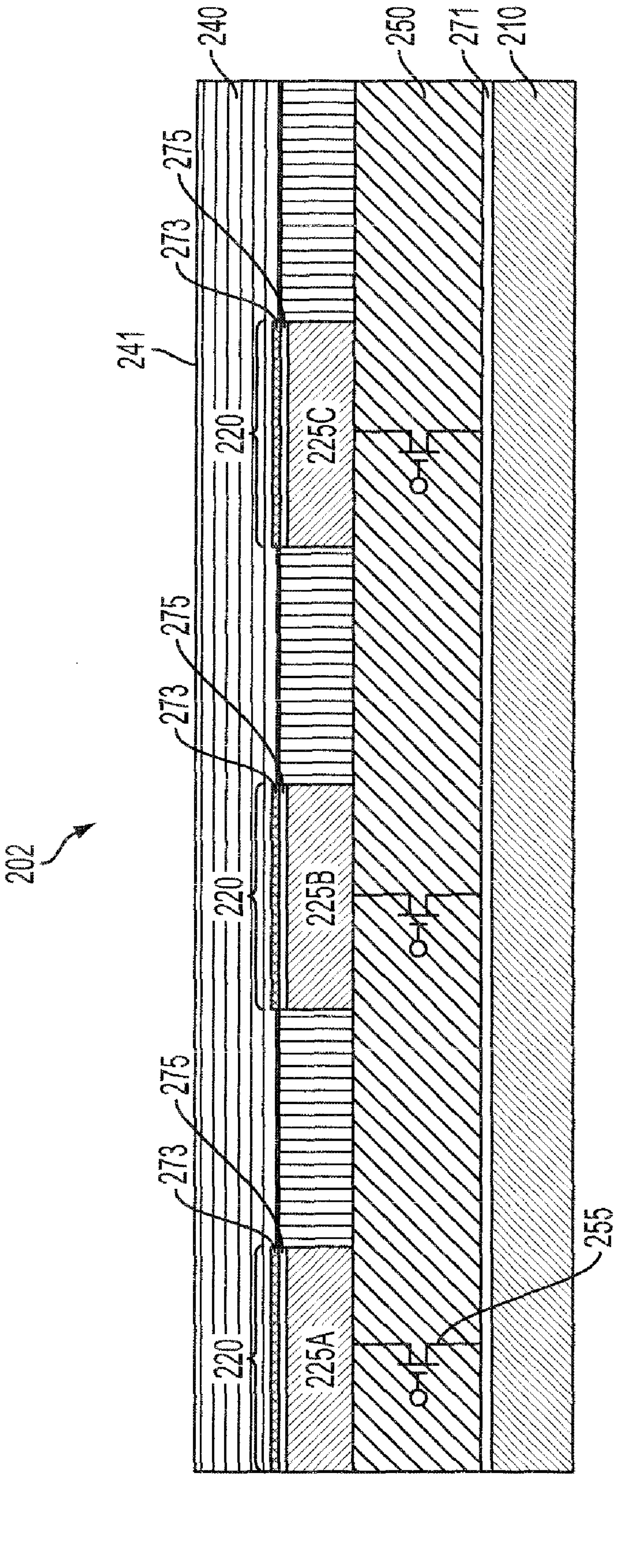
FIG. 2 schematically illustrates a cross sectional view of a portion of an exemplary nano-enabled imaging member in accordance with various embodiments of the present teachings.

FIG. 2 schematically illustrates a cross sectional view of a portion of the nano-enabled imaging member 102, 202, in accordance with various embodiments of the present teachings. The nano-enabled imaging member 102, 202 can include an array 220 of hole-injecting pixels 225 disposed over a substrate 210, such that each pixel 225 of the array is electrically isolated and is individually addressable. The nano-enabled imaging member 102, 202 can also include an array 250 of thin film transistors 255 disposed over the substrate 210, such that each thin film transistor 255 can be coupled to one pixel 225 of the array 220. The nano-enabled imaging member 102, 202 can further include a charge transport layer 240 disposed over the array 220 of hole-injecting pixels 225, wherein the charge transport layer 240 can include a surface 241 disposed opposite to the array 220 of hole-injecting pixels. The charge transport layer 240 can be configured to transport holes provided by the one or more pixels 225 to the surface 241. As used herein, the terms "hole-injecting pixel" and "array of hole-injecting pixels" are used interchangeably with the terms "pixel" and "array of pixels".

The phrase "individually addressable" as used herein means that each pixel of an array of hole-injecting pixels can be identified and manipulated independently from its neighboring or surrounding pixel(s). For example, referring to FIG. 2 each pixel 225A, 225B, or 225C can be individually turned on or off independently from its neighboring or surrounding pixels. However in some embodiments, instead of addressing the pixels 225A-C individually, a group of pixels, e.g., two or more pixels 225A-B can be selected and addressed together, i.e. the group of pixels 225A-B can be turned on or off together independently from the other pixels 225C or other groups of pixels (not illustrated).

In various embodiments, each pixel 225 of the array 220 can include a layer of nano-carbon materials. In other embodiments, each pixel 225 of the array 220 can include a layer of organic conjugated polymers. Yet in some other embodiments, each pixel 225 of the array 220 can include a layer of a mixture of nano-carbon materials and organic conjugated polymers including, for example, nano-carbon materials dispersed in one or more organic conjugated polymers. In certain embodiments, the surface resistivity of the layer including the one or more of nano-carbon materials and/or organic conjugated polymers can be from about 10 ohm/sq. to about 10,000 ohm/sq. or from about 10 ohm/sq. to about 5,000 ohm/sq. or from about 100 ohm/sq. to about 2,500 ohm/sq. The nano-carbon materials and the organic conjugated polymers can act as the hole-injection materials for the electrostatic generation of latent images. One of the advantages of using nano-carbon materials and the organic conjugated polymers as hole injection materials is that they can be easily patterned by various fabrication techniques, such as, for example, photolithography, inkjet printing, screen printing, transfer printing, and the like.

Hole-Injecting Pixels Including Nano-Carbon Materials

As used herein, the phrase "nano-carbon material" refers to a carbon-containing material having at least one dimension on the order of nanometers, for example, less than about 1000 nm. In embodiments, the nano-carbon material can include, for example, nanotubes including single-wall carbon nanotubes (SWNT), double-wall carbon nanotubes (DWNT), and multi-wall carbon nanotubes (MWNT); functionalized carbon nanotubes; and/or graphenes and functionalized graphenes, wherein graphene is a single planar sheet of $sp^2$-hybridized bonded carbon atoms that are densely packed in a honeycomb crystal lattice and is exactly one atom in thickness with each atom being a surface atom.

Carbon nanotubes, for example, as-synthesized carbon nanotubes after purification, can be a mixture of carbon nanotubes structurally with respect to number of walls, diameter, length, chirality, and/or defect rate. For example, chirality may dictate whether the carbon nanotube is metallic or semiconductive. Metallic carbon nanotubes can be about 33% metallic. Carbon nanotubes can have a diameter ranging from about 0.1 nm to about 100 nm, or from about 0.5 nm to about 50 nm, or from about 1.0 nm to about 10 nm; and can have a length ranging from about 10 nm to about 5 mm, or from about 200 nm to about 10 μm, or from about 500 nm to about 1000 nm. In certain embodiments, the concentration of carbon nanotubes in the layer including one or more nano-carbon materials can be from about 0.5 weight % to about 99 weight %, or from about 50 weight % to about 99 weight %, or from about 90 weight % to about 99 weight %. In embodiments, the carbon nanotubes can be mixed with a binder material to form the layer of one or more nano-carbon materials. The binder material can include any binder polymers as known to one of ordinary skill in the art.

In various embodiments, the thin layer of nano-carbon materials in each pixel 225 can include a solvent coatable carbon nanotube layer. The solvent coatable carbon nanotube layer can be coated from an aqueous dispersion or an alcohol dispersion of carbon nanotubes wherein the carbon nanotubes can be stabilized by a surfactant or a DNA or a polymeric material. In other embodiments, the thin layer of carbon nanotubes can include a carbon nanotube composite, including but not limited to carbon nanotube polymer composite and carbon nanotube filled resin.

Hole-Injecting Pixels Including Organic Conjugated Polymers

In various embodiments, the layer of organic conjugated polymers in each pixel 225 can include any suitable material, for example, conjugated polymers based on ethylenedioxythiophene (EDOT) or based on its derivatives. The conjugated polymers can include, but are not limited to, poly(3,4-ethylenedioxythiophene) (PEDOT), alkyl substituted EDOT, phenyl substituted EDOT, dimethyl substituted polypropylenedioxythiophene, cyanobiphenyl substituted 3,4-ethylenedioxythiopene (EDOT), teradecyl substituted PEDOT, dibenzyl substituted PEDOT, an ionic group substituted PEDOT, such as, sulfonate substituted PEDOT, a dendron substituted PEDOT, such as, dendronized poly(para-phenylene), and the like, and mixtures thereof. In further embodiments, the organic conjugated polymer can be a complex including PEDOT and, for example, polystyrene sulfonic acid (PSS). The molecular structure of the PEDOT-PSS complex can be shown as the following:

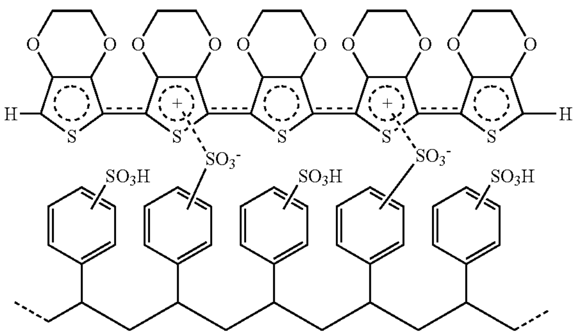

The exemplary PEDOT-PSS complex can be obtained through the polymerization of EDOT in the presence of the template polymer PSS. The conductivity of the layer containing the PEDOT-PSS complex can be controlled, e.g., enhanced, by adding compounds with two or more polar groups, such as for example, ethylene glycol, into an aqueous solution of PEDOT-PSS. As discussed in the thesis of Alexander M. Nardes, entitled "On the Conductivity of PEDOT-PSS Thin Films," 2007, Chapter 2, Eindhoven University of Technology, which is hereby incorporated by reference in its entirety, such an additive can induce conformational changes in the PEDOT chains of the PEDOT-PSS complex. The conductivity of PEDOT can also be adjusted during the oxidation step. Aqueous dispersions of PEDOT-PSS are commercially available as BAYTRON P® from H. C. Starck, Inc. (Boston, Mass.). PEDOT-PSS films coated on Mylar are commercially available in Orgacon™ films (Agfa-Gevaert Group, Mortsel, Belgium). PEDOT may also be obtained through chemical polymerization, for example, by using electrochemical oxidation of electron-rich EDOT-based monomers from aqueous or non-aqueous medium. Exemplary chemical polymerization of PEDOT can include those disclosed by Li Niu et al., entitled "Electrochemically Controlled Surface Morphology and Crystallinity in Poly(3,4-ethylenedioxythiophene) Films," Synthetic Metals, 2001, Vol. 122, 425-429; and by Mark Lefebvre et al., entitled "Chemical Synthesis, Characterization, and Electrochemical Studies of Poly(3,4-ethylenedioxythiophene)/Poly(styrene-4-sulfonate) Composites," Chemistry of Materials, 1999, Vol. 11, 262-268, which are hereby incorporated by reference in their entirety. As also discussed in the above references, the electrochemical synthesis of PEDOT can use a small amount of monomer, and a short polymerization time, and can yield electrode-supported and/or freestanding films.

In various embodiments, the array of pixels 225 can be formed by first forming a layer including nano-carbon materials and/or organic conjugated polymers over the substrate 210. Any suitable methods can be used to form this layer including, for example, dip coating, spray coating, spin coating, web coating, draw down coating, flow coating, and/or extrusion die coating. The layer including nano-carbon materials and/or organic conjugated polymers over the substrate 210 can then be patterned or otherwise treated to create an array of pixels 225. Suitable nano-fabrication techniques can be used to create the array of pixel 225 including, but not limited to, photolithographic etching, or direct patterning. For example, the materials can be directly patterned by nano-imprinting, inkjet printing and/or screen printing. As a result, each pixel 225 of the array 220 can have at least one dimension, e.g., length or width, ranging from about 100 nm to about 500 μm, or from about 1 μm to about 250 μm, or from about 5 μm to about 150 μm.

Any suitable material can be used for the substrate 210 including, but not limited to, mylar, polyimide (PI), flexible stainless steel, poly(ethylene napthalate) (PEN), and flexible glass.

Charge Transport Layer

Referring back to FIG. 2, the nano-enabled imaging member 202 can also include the charge transport layer 240 configured to transport holes provided by the one or more pixels 225 to the surface 241 on an opposite side to the array of pixels 225. The charge transport layer 240 can include materials capable of transporting either holes or electrons through the charge transport layer 240 to selectively dissipate a surface charge. In certain embodiments, the charge transport layer 240 can include a charge-transporting small molecule dissolved or molecularly dispersed in an electrically inert polymer. In one embodiment, the charge-transporting small molecule can be dissolved in the electrically inert polymer to form a homogeneous phase with the polymer. In another embodiment, the charge-transporting small molecule can be molecularly dispersed in the polymer at a molecular scale. Any suitable charge transporting or electrically active small molecule can be employed in the charge transport layer 240. In embodiments, the charge transporting small molecule can include a monomer that allows free holes generated at the interface of the charge transport layer and the pixel 225 to be transported across the charge transport layer 240 and to the surface 241. Exemplary charge-transporting small molecules can include, but are not limited to, pyrazolines such as, for example, 1-phenyl-3-(4'-diethylamino styryl)-5-(4"-diethylamino phenyl)pyrazoline; diamines such as, for example, N,N'-diphenyl-N,N'-bis(3-methylphenyl)-(1,1'-biphenyl)-4,4'-diamine (TPD); other arylamines like triphenyl amine, N,N,N',N'-tetra-p-tolyl-1,1'-biphenyl-4,4'-diamine (TM-TPD); hydrazones such as, for example, N-phenyl-N-methyl-3-(9-ethyl)carbazyl hydrazone and 4-diethyl amino benzaldehyde-1,2-diphenyl hydrazone; oxadiazoles such as, for example, 2,5-bis(4-N,N'-diethylaminophenyl)-1,2,4-oxadiazole; stilbenes; aryl amines; and the like. Exemplary aryl amines can have the following formulas/structures:

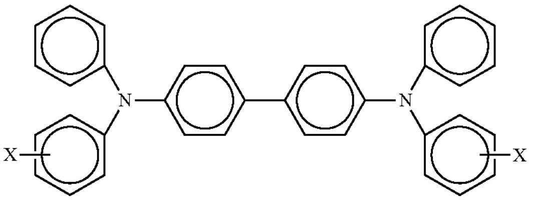

and

-continued

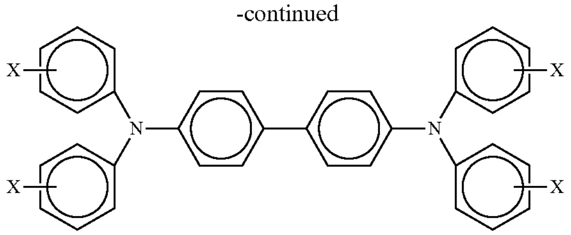

wherein X is a suitable hydrocarbon like alkyl, alkoxy, aryl, and derivatives thereof; a halogen, or mixtures thereof, and especially those substituents selected from the group consisting of Cl and $CH_3$; and molecules of the following formulas

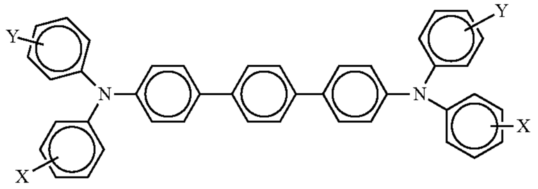

and

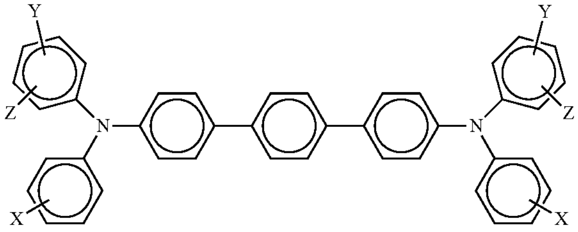

wherein X, Y and Z are independently alkyl, alkoxy, aryl, a halogen, or mixtures thereof, and wherein at least one of Y and Z is present.

Alkyl and/or alkoxy groups can include, for example, from 1 to about 25 carbon atoms, or from 1 to about 18 carbon atoms, or from 1 to about 12 carbon atoms, such as methyl, ethyl, propyl, butyl, pentyl, and/or their corresponding alkoxides. Aryl group can include, e.g., from about 6 to about 36 carbon atoms of such as phenyl, and the like. Halogen can include chloride, bromide, iodide, and/or fluoride. Substituted alkyls, alkoxys, and aryls can also be used in accordance with various embodiments.

Examples of specific aryl amines that can be used for the charge transport layer 240 can include, but are not limited to, N,N'-diphenyl-N,N'-bis(alkylphenyl)-1,1'-biphenyl-4,4'-diamine wherein alkyl is selected from the group consisting of methyl, ethyl, propyl, butyl, hexyl, and the like; N,N'-diphenyl-N,N'-bis(halophenyl)-1,1'-biphenyl-4,4'-diamine wherein the halo substituent is a chloro substituent; N,N'-bis(4-butylphenyl)-N,N'-di-p-tolyl-[p-terphenyl]-4,4"-diamine, N,N'-bis(4-butylphenyl)-N,N'-di-m-tolyl-[p-terphenyl]-4,4"-diamine, N,N'-bis(4-butylphenyl)-N,N'-di-o-tolyl-[p-terphenyl]-4,4"-diamine, N,N'-bis(4-butylphenyl)-N,N'-bis-(4-isopropylphenyl)-[p-terphenyl]-4,4"-diamine, N,N'-bis(4-butylphenyl)-N,N'-bis-(2-ethyl-6-methylphenyl)-[p-terphenyl]-4,4"-diamine, N,N'-bis(4-butylphenyl)-N,N'-bis-(2,5-dimethylphenyl)-[p-terphenyl]-4,4'-diamine, N,N'-diphenyl-N,N'-bis(3-chlorophenyl)-[p-terphenyl]-4,4"-diamine, and the like. Any other known charge transport layer molecules can be selected such as, those disclosed in U.S. Pat. Nos. 4,921,773 and 4,464,450, the disclosures of which are incorporated herein by reference in their entirety.

As indicated above, suitable electrically active small molecule charge transporting molecules or compounds can be dissolved or molecularly dispersed in electrically inactive polymeric film forming materials. If desired, the charge transport material in the charge transport layer 240 can include a polymeric charge transport material or a combination of a small molecule charge transport material and a polymeric charge transport material. Any suitable polymeric charge transport material can be used, including, but not limited to, poly(N-vinylcarbazole); poly(vinylpyrene); poly(-vinyltetraphene); poly(vinyltetracene) and/or poly(vinylperylene).

Any suitable electrically inert polymer can be employed in the charge transport layer 240. Typical electrically inert polymer can include polycarbonates, polyarylates, polystyrenes, acrylate polymers, vinyl polymers, cellulose polymers, polyesters, polysiloxanes, polyimides, polyurethanes, poly(cyclo olefins), polysulfones, and epoxies, and random or alternating copolymers thereof. However, any other suitable polymer can also be utilized in the charge transporting layer 240 such as those listed in U.S. Pat. No. 3,121,006, the disclosure of which is incorporated herein by reference in its entirety.

In various embodiments, the charge transport layer 240 can include optional one or more materials to improve lateral charge migration (LCM) resistance including, but not limited to, hindered phenolic antioxidants, such as, for example, tetrakis methylene(3,5-di-tert-butyl-4-hydroxy hydrocinnamate) methane (IRGANOX® 1010, available from Ciba Specialty Chemical, Tarrytown, N.Y.), butylated hydroxytoluene (BHT), and other hindered phenolic antioxidants including SUMILIZER™ BHT-R, MDP-S, BBM-S, WX-R, NW, BP-76, BP-101, GA-80, GM, and GS (available from Sumitomo Chemical America, Inc., New York, N.Y.), IRGANOX® 1035, 1076, 1098, 1135, 1141, 1222, 1330, 1425WL, 1520L, 245, 259, 3114, 3790, 5057, and 565 (available from Ciba Specialties Chemicals, Tarrytown, N.Y.), and ADEKA STAB™ AO-20, AO-30, AO-40, AO-50, AO-60, AO-70, AO-80, and AO-330 (available from Asahi Denka Co., Ltd.); hindered amine antioxidants such as SANOL™ LS-2626, LS-765, LS-770, and LS-744 (available from SANKYO CO., Ltd.), TINUVIN® 144 and 622LD (available from Ciba Specialties Chemicals, Tarrytown, N.Y.), MARK™ LA57, LA67, LA62, LA68, and LA63 (available from Amfine Chemical Corporation, Upper Saddle River, N.J.), and SUMILIZER® TPS (available from Sumitomo Chemical America, Inc., New York, N.Y.); thioether antioxidants such as SUMILIZER® TP-D (available from Sumitomo Chemical America, Inc., New York, N.Y.); phosphite antioxidants such as MARK™ 2112, PEP-8, PEP-24G, PEP-36, 329K, and HP-10 (available from Amfine Chemical Corporation, Upper Saddle River, N.J.); other molecules such as bis(4-diethylamino-2-methylphenyl)phenylmethane (BDETPM), bis-[2-methyl-4-(N-2-hydroxyethyl-N-ethyl-aminophenyl)]-phenylmethane (DHTPM), and the like. The charge transport layer 240 can have antioxidant in an amount ranging from about 0 to about 20 weight %, from about 1 to about 10 weight %, or from about 3 to about 8 weight % based on the total charge transport layer.

The charge transport layer 240 including charge-transporting molecules or compounds dispersed in an electrically inert polymer can be an insulator to the extent that, the electrostatic charge placed on the charge transport layer 240 is not conducted such that formation and retention of an electrostatic latent image thereon can be prevented. On the other hand, the charge transport layer 240 can be electrically "active" in that it allows the injection of holes from the layer including one or more of nano-carbon materials and organic conjugated polymers in each pixel 225 of the array of hole-injecting pixels 220, and allows these holes to be transported through the charge transport layer 240 itself to enable selective discharge of a negative surface charge on the surface 241.

Any suitable and conventional techniques can be utilized to form and thereafter apply the charge transport layer 240 over the array of pixels 225. For example, the charge transport layer 240 can be formed in a single coating step or in multiple coating steps. These application techniques can include spraying, dip coating, roll coating, wire wound rod coating, ink jet coating, ring coating, gravure, drum coating, and the like.

Drying of the deposited coating can be effected by any suitable conventional technique such as oven drying, infra red radiation drying, air drying and the like. The charge transport layer 240 after drying can have a thickness in the range of about 1 μm to about 50 μm, about 5 μm to about 45 μm, or about 15 μm to about 40 μm, but can also have thickness outside this range.

Optional Adhesion Layer

In some embodiments, the nano-enabled imaging member 202 can also include an optional adhesion layer 271 disposed between the substrate 210 and each pixel 225 of the array of pixels 225. Exemplary polyester resins which may be utilized for the optional adhesion layer can include polyarylatepolyvinylbutyrals, such as, U-100 available from Unitika Ltd., Osaka, JP; VITEL PE-100, VITEL PE-200, VITEL PE-200D, and VITEL PE-222, all available from Bostik, Wauwatosa, Wis.; MOR-ESTER™ 49000-P polyester available from Rohm Hass, Philadelphia, Pa.; polyvinyl butyral; and the like.

Optional Hole Blocking Layer

The nano-enabled imaging member 202 can also include an optional hole blocking layer 275 disposed between the layer including one or more of nano-carbon materials and/or organic conjugated polymers in the pixel 225 and the charge transport layer 240. In some embodiments, an optional adhesion layer 273 can be disposed between the charge transport layer 240 and the hole blocking layer 275 and/or between the hole blocking layer 275 and the pixel 225 including the layer of one or more nano-carbon materials and organic conjugated polymers.

The hole blocking layer 275 can include polymers such as, for example, polyvinylbutryrals, epoxy resins, polyesters, polysiloxanes, polyamides, polyurethanes and the like; nitrogen containing siloxanes or nitrogen containing titanium compounds such as, for example, trimethoxysilyl propylene diamine, hydrolyzed trimethoxysilyl propyl ethylene diamine, N-beta-(aminoethyl) gamma-amino-propyl trimethoxy silane, isopropyl 4-aminobenzene sulfonyl, di(dodecylbenzene sulfonyl) titanate, isopropyl di(4-aminobenzoyl)isostearoyl titanate, isopropyl tri(N-ethylamino-ethylamino)titanate, isopropyl trianthranil titanate, isopropyl tri(N,N-dimethylethylamino)titanate, titanium-4-amino benzene sulfonate oxyacetate, titanium 4-aminobenzoate isostearate oxyacetate, $[H_2N(CH_2)_4]CH_3Si(OCH_3)_2$, (gamma-aminobutyl)methyl diethoxysilane, and $[H_2N(CH_2)_3]CH_3Si(OCH_3)_2$ (gamma-aminopropyl)methyl diethoxysilane, as disclosed in U.S. Pat. Nos. 4,338,387, 4,286,033 and 4,291,110, the disclosures of which are incorporated by reference herein in their entirety. The hole blocking layer 275 can have a thickness in the range of about 0.005 μm to about 0.5 μm, or about 0.01 μm to about 0.1 μm, or about 0.03 μm and about 0.06 μm.

Negatively-Biased Development Subsystem

Figure 3:
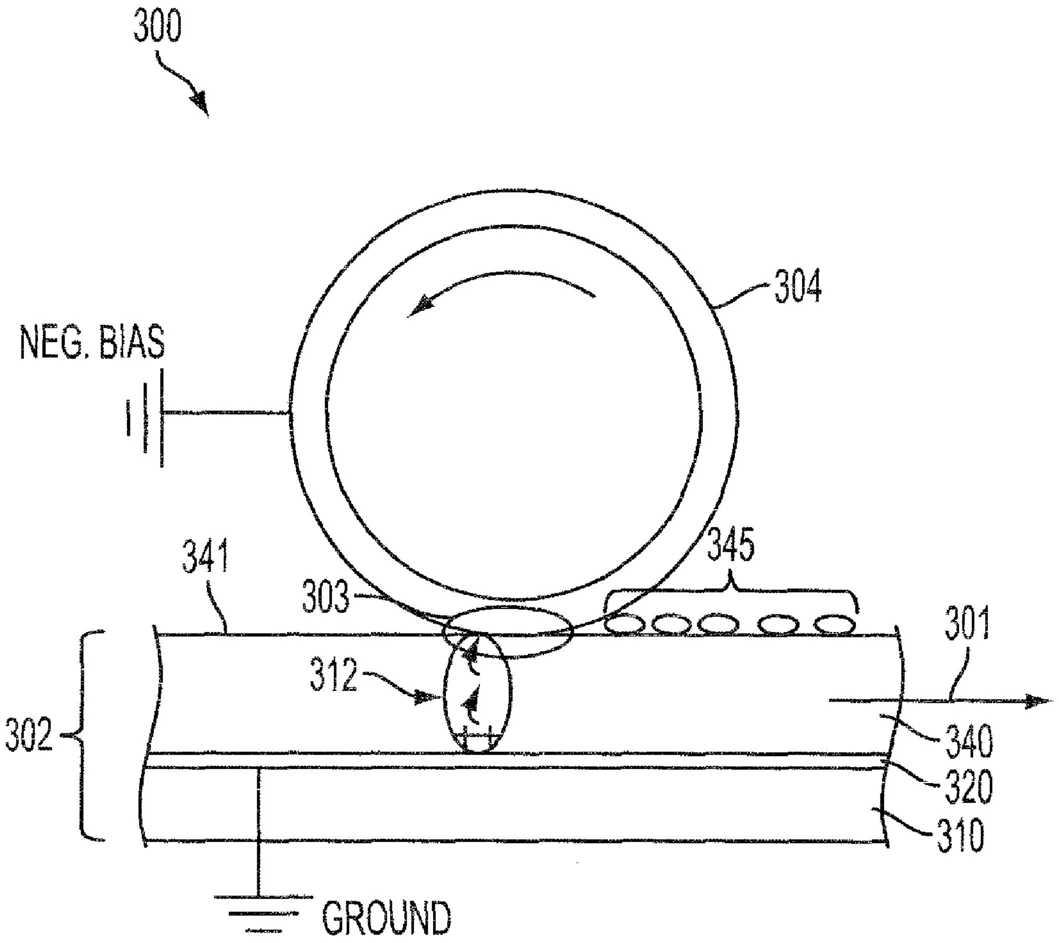
FIG. 3 schematically illustrates a blown up view of a portion of the exemplary digital marking system shown in FIG. 1 in accordance with various embodiments of the present teachings.
Figure 4:
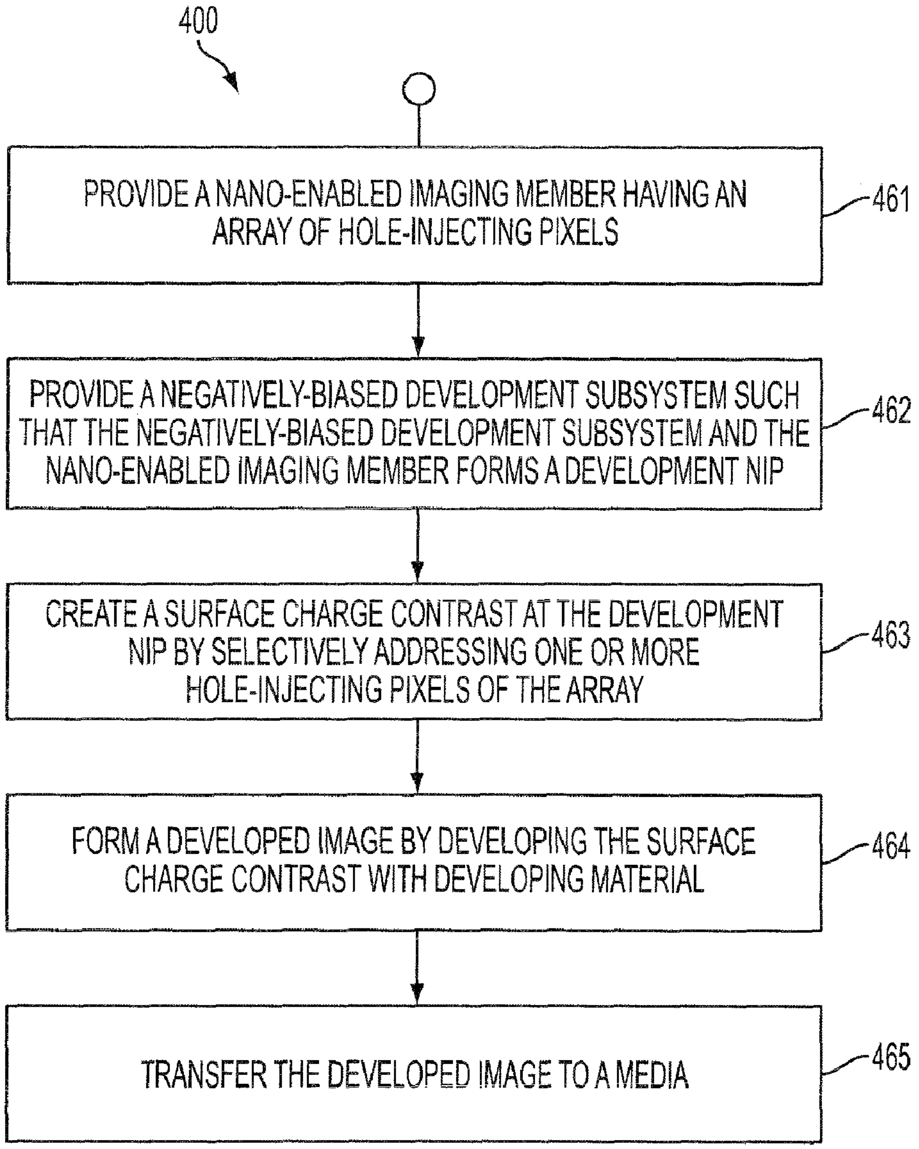
FIG. 4 illustrates an exemplary method of printing an image onto a media in accordance with various embodiments of the present teachings.

Referring back to FIG. 1, the direct digital marking system 100 can also include a negatively-biased development subsystem 104 in proximity to the nano-enabled imaging member 102, such that the negatively-biased development subsystem 104 and the nano-enabled imaging member 102 can form a development nip 103. FIG. 3 schematically illustrates a blown up view of a portion of the exemplary digital marking system shown in FIG. 1. As shown in FIG. 3, under the application of negative-bias via the negatively-biased development subsystem 104, 304, the individual pixels of the one or more pixels of the array 320 of hole-injecting pixels can be addressed to inject holes which can be transported through the charge transport layer 340 in the hole-injection zone 312, thereby creating a surface charge contrast or in other words an electrostatic latent image on the surface 341 of the charge transport layer 340 within the development nip 303. The surface charge contrast/electrostatic latent image can then be developed at the development nip 303 using any suitable developing material to form a developed image 345. Exemplary developing materials can include, but are not limited to, powder toner, liquid toner, hydrocarbon based liquid ink, and/or flexo/offset ink. Development occurs due to an electrostatic attraction between the developing material and oppositely-charged areas on the surface 341 of the charge transport layer 340 of the nano-enabled imaging member 302. The development subsystem electrostatics can be adjusted so that development can take place in either the charged areas or the discharged areas of the surface charge contrast on the surface 341 of the charge transport layer 340. Discharged-area development can be generally preferred since the image areas typically include, in one example, about 6% of the total document area.

For direct digital marking system 100, areas of the nano-enabled imaging member 102, 202, 302 that are discharged by hole injection can be developed by developing material with the same polarity as the charged nano-enabled imaging member 102, 202, 302 (typically negative). By setting the voltage on the development subsystem 104, 304 at a level near the charging potential of the nano-enabled imaging member 102, 202, 302, developing material from the development subsystem 104, 304 can be attracted to the nano-enabled imaging member 102, 202, 302 in the surface charge contrast/electrostatic latent image on the surface 341.

The function of the development subsystem 104, 304 is to present charged developing material to the surface charge contrast on the surface 341 of the nano-enabled imaging member 102, 202, 302, so that the developing material can selectively adhere to the discharged areas to form a developed image 145, 345 on the nano-enabled imaging member 102, 202, 302. There can be many ways to perform this function, depending on the cost, size, and image quality required for the development subsystem 104, 304. One option can be a two component magnetic brush development, where the two components are developing material and larger (e.g., of about 30 to 70 microns in diameter) magnetic particles called carrier particles. The developing material, for example, toner particles can be charged by the phenomenon of triboelectricity (often referred to as static electricity) and can adhere to the carrier. The developer including the toner particles and the carrier particles can then be picked up by a magnetic roll, which results in a magnetic brush on the magnetic roll. Toner particles can then be electrostatically attracted to the discharged areas of the nano-enabled imaging member 102, 202, 302, but repelled from the charged areas, thereby developing the latent image. Following development, the carrier can be returned to the development sump where it can acquire fresh toner.

Another option can be a donor roll. When the donor roll is used, a non-contact development can be performed. In this configuration, the toner on the magnetic brush can be electrostatically transferred to a donor roll, for example, a ceramic roll, forming a thin layer of charged toner. The charged toner on the donor roll can then be electrostatically developed onto the discharged area of the nano-enabled imaging member. In embodiments, the gap between the donor roll and the nano-enabled imaging member can range from about 10 microns to about 50 microns.

Transfer Subsystem

Referring back to FIG. 1, the direct digital marking system 100 can also include a transfer subsystem 108 for transferring the developed image onto a media. During transferring, the media can come in substantially close contact with the developed image 145 or 345 on the surface (see 341 in FIG. 3) of the nano-enabled imaging member 102, 202, 302. The transfer corona unit (not shown) behind the media 106 can give the media 106 a charge opposite that of the developing material and strong enough to overcome the developing material's adhesion to the nano-enabled imaging member 102, 202, 302. A second precisely controlled corona charge unit (not shown) can reduce the electrostatic adhesion of the media 106 to the nano-enabled imaging member 102, 202, 302 to enable release of the media 106, now containing the developed image transferred from the nano-enabled imaging member 102, 202, 302. Alternatively, the transfer subsystem 108 can be a bias-able transfer roll as known to one of ordinary skill in the art.

For black and white printers, the nano-enabled imaging member 102, 202, 302 can transfer the developed image 145 or 345 directly to the media 106. However, for most color printers the image can be formed from four colors (cyan, magenta, yellow and black) of the developing material and the developed image can be built up first on an intermediate surface. In some embodiments, the direct digital marking system 100 can include four nano-enabled imaging members 102, 202, 302 which can develop cyan, magenta, yellow, and black latent electrostatic images. Each colored developed image can then be transferred to a transfer belt in sequence. Once the full-color developed image is on the transfer belt, then another transfer can take place where the full-color developed image can be transferred to the media 106. However, the color printer can use a different sequence of events ultimately leading to a full-color developed image on the media. In the example of tandem configuration, each colored developed image can be transferred to the media in sequence.

Fuser Subsystem

The direct digital marking system 100 can also include a fuser subsystem 105, which can also be a transfixing system with transfer and fixing to the media at the same time, to fix the developed image onto the media. In the fusing process, the developing material can be heated under pressure so that it coalesces and penetrates into the media 106, such as paper fibers. Fusing can be accomplished by passing the media through a pair of rollers. A heated roll can melt the developing material, which can be fused to the media under the application of pressure from a second roll. The gloss of the visible image can be controlled by the temperature, pressure, and the length of time the developing material remains in the fuser nip.

In some embodiments, the direct digital marking system 100 can include a transfuse system to transfer and fuse the developed image onto the media 106 in one step instead of separate transfer subsystem and fusing subsystem.

Cleaning Subsystem

In some embodiments, the direct digital marking system 100 can further include a cleaning subsystem 109. The transfer of the developing material from the nano-enabled imaging member 102, 202, 302 to the media may not be 100% efficient in some cases. This is because the small developing material such as small toner particles and toner particles with a low charge can have a strong adhesion to the nano-enabled imaging member 102, 202, 302 and as a result they can remain there after transfer. These particles must be removed from the nano-enabled imaging member 102, 202, 302 before the next print cycle, or they can affect the printing quality of the next image.

In some embodiments, the cleaning subsystem 109 can include a compliant cleaning blade. The blade can rub against the nano-enabled imaging member 102, 202, 302 and can scrape off any developing material that attempts to pass under it. In other embodiments, the cleaning subsystem 109 can include a rotating brush cleaner, which can be more efficient at removing developing material and less abrasive to the surface of the nano-enabled imaging member 102, 202, 302.

According to various embodiments, there is a method 400 of printing an image onto a media. The method can include a step 461 of providing a nano-enabled imaging member, such as, for example, the nano-enabled imaging member 202 shown in FIG. 2. The nano-enabled imaging member 202 can include an array 220 of hole-injecting pixels 225 disposed over a substrate 210 and a charge transport layer 240 disposed over the array of hole-injecting pixels, wherein each pixel 225 of the array 220 of hole-injecting pixels 225 is electrically isolated and individually addressable. The nano-enabled imaging member 202 can also include an array of thin film transistors 250 disposed between the substrate 210 and the array 220 of pixels, such that each thin film transistor 255 can be coupled to one pixel 225 of the array 220. The method 400 can also include a step 462 of providing a negatively-biased development subsystem, such as, for example, the development subsystem 104, 304 shown in FIGS. 1 and 3. The negatively-biased development subsystem 104, 304 can be disposed in proximity to the nano-enabled imaging member 102, 302, such that the negatively-biased development subsystem 104, 304 and the nano-enabled imaging member 102, 302 can form a development nip 103, 303, as shown in FIGS. 1 and 3. The method 400 of printing an image onto a media can further include a step 463 of creating a surface charge contrast or an electrostatic latent image at the development nip on a surface of the charge transport layer 240, 340 by individually addressing one or more hole-injecting pixels. As shown in FIG. 3, the one or more addressed pixels 320 can inject holes at the interface of the one or more pixels 320 and the charge transport layer 340 and the charge transport layer 340 can transport the holes to the surface 341. In various embodiments, the step 463 of individually addressing one or more hole-injecting pixels can include applying an electrical bias to one or more hole-injecting pixels via thin film transistors to either enable hole injection or disable hole injection at the interface of the one or more hole-injecting pixels and the charge transport layer. The method 400 can also include the step 464 of developing the surface charge contrast with developing material at the development nip to form a developed visible image on the surface of the charge transport layer. Development can be done using any suitable development subsystem, such as, for example, magnetic brush and donor roll. The method 400 of printing an image onto a media can also include a step 465 of transferring the visible image onto a media. The method 400 of printing an image onto a media can also include transfixing, fixing, and/or fusing the image onto the media. The method 400 can further include cleaning the nano-enabled imaging member 102, 302.

The steps 463 and 464 of creating an electrostatic latent image/surface charge contrast and developing the electrostatic latent image/surface charge contrast to form a developed image both occur within the development nip, resulting in a direct printing without the use of photoreceptor, laser rastor output scanner (ROS), or charging subsystem such as corotron. The lack of photoreceptor, laser ROS, and charging subsystem in a marking system not only simplifies the printing process, but also reduces the unit manufacturing cost (UMC), and run cost.

The following examples are illustrative of various embodiments and their advantageous properties, and are not to be taken as limiting the disclosure or claims in any way.

EXAMPLES

Example 1

Preparation of a Bi-Layer Imaging Member Including Carbon Nanotube Film and a Charge Transport Layer Four bi-layer imaging members (A, B, C, D) were formed by first depositing a layer of single wailed carbon nanotube (CNT) film as a hole injection layer on each of four Mylar substrates such that each CNT film on the Mylar substrate had a surface resistivity of about 100 Ω/sq, about 250 Ω/sq, about 1000 Ω/sq, and about 2500 Ω/sq. Then, a solution of about 14 wt. % (solid) containing N,N'-diphenyl-N,N-bis(3-methyl phenyl)-1,1'-biphenyl-4,4'-diamine (TPD) and PCZ200 (a polycarbonate) in a mixed solvent of tetrahydrofuran and toluene (70:30 in ratio) was coated over each of the four CNT films (on Mylar) on a lab draw-down coater using a 3-5 mil draw bar to form a charge transport layer (CTL) of about 20 μm thick. The thickness of the CTL was controlled by the solid concentration of the coating solution as well as the wet gap of the draw bar. The resulting bi-layer imaging members (A, B, C, D) were air dried for about 30 minutes followed by vacuum drying at about 100° C. for about 2 hours before electrical evaluation.

Example 2

Preparation of a Bi-Layer Imaging Member Including PEDOT and a Charge Transport Layer Three bi-layer imaging members (E, F, G) were formed by first depositing a layer of PEDOT on each of three Mylar substrates such that each PEDOT film had a surface resistivity of about 350 Ω/sq, about 1500 Ω/sq, and about 2500 Ω/sq. The PEDOT films with surface resistivity of about 350 Ω/sq. and about 1500 Ω/sq. were obtained from Agfa-Gevaert Group (Mortsel, Belgium). The PEDOT film with surface resistivity of about 2500 Ω/sq was coated internally using a web coater with the PEDOT ink purchased from Orgacon films Ltd. A solution of about 14 wt. % (solid) containing N,N'-diphenyl-N,N-bis(3-methyl phenyl)-1,1'-biphenyl-4, 4'-diamine (TPD) and PCZ200 (a polycarbonate) in a mixed solvent of tetrahydrofuran and toluene (70:30 in ratio) was then coated over each of the three PEDOT films (on Mylar) on a lab draw-down coater using a 3-5 mil draw bar to form a charge transport layer (CTL) of about 20 μm thick. The thickness of the CTL was controlled by the solid concentration of the coating solution as well as the wet gap of the draw bar. The resulting bi-layer imaging members (E, F, G) were air dried for about 30 minutes followed by vacuum drying at about 100° C. for about 2 hours before electrical evaluation.

Example 3

Charge-Discharge Characteristics of the Bi-Layer Imaging Members

Figure 5:
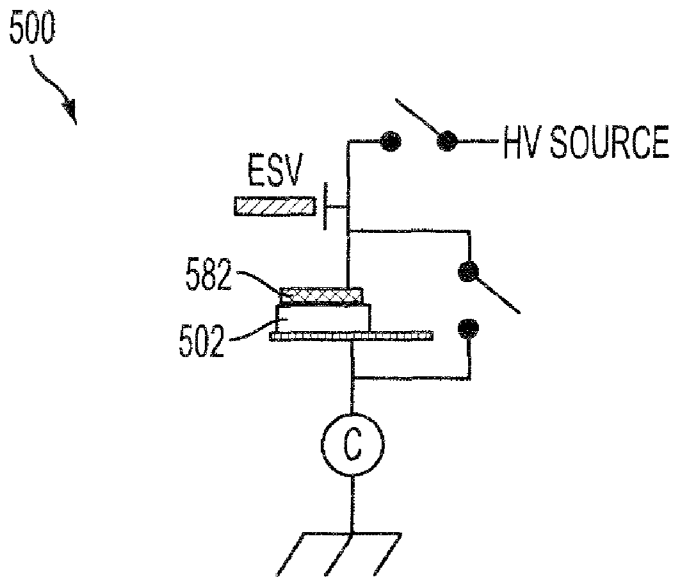
FIG. 5 illustrates a static scanner used to measure the charge-discharge characteristics of exemplary bi-layer imaging members in accordance with various embodiments of the present teachings.

The charge-discharge characteristics of the bi-layer imaging members of Example 1 and Example 2 were evaluated using an in-house static scanner 500, as shown schematically in FIG. 5. A gold dot 582 was evaporated on the CTL layer of each bi-layer imaging member 502 for the electrical contact. Each bi-layer imaging member 502 was charged by a high voltage power supply and the surface potential was monitored using an electrostatic voltmeter (ESV). The high voltage power supply and the ESV were part of the static scanner and were both obtained from TREK, Inc. (New York) including a Trek model 610B corotrol power supply and a Trek model 368A high-speed electrostatic voltmeter. The motionless scanner was built internally at Xerox. Since the bi-layer imaging member was "static" throughout the measurement, the charging and monitoring of the surface potential was controlled electronically through an electric circuit within the static scanner. Typically there was a ~0.1 s delay between charging and monitoring.

Figure 6A:
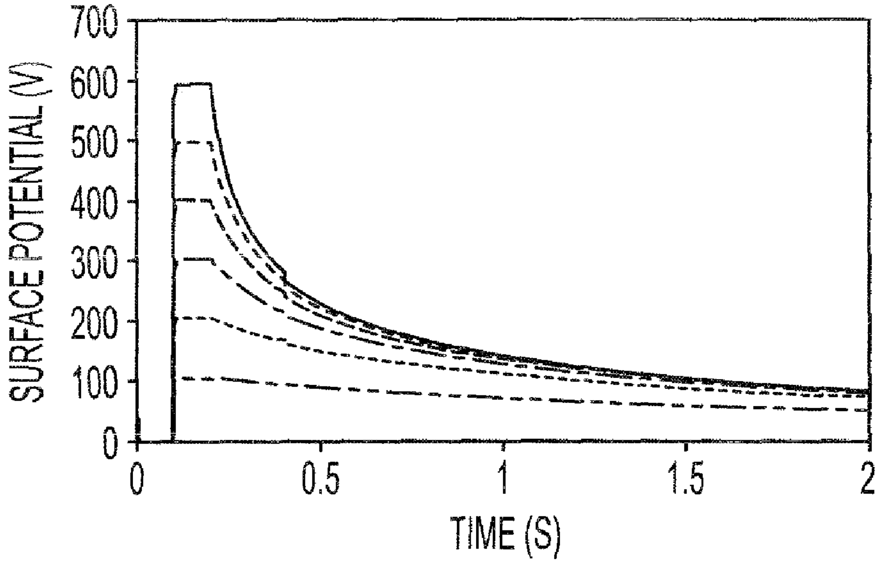
FIGS. 6A-6B compare charge-discharge curves of an exemplary carbon nanotube bi-layer imaging member and a control member in accordance with various embodiments of the present teachings.
Figure 6B:
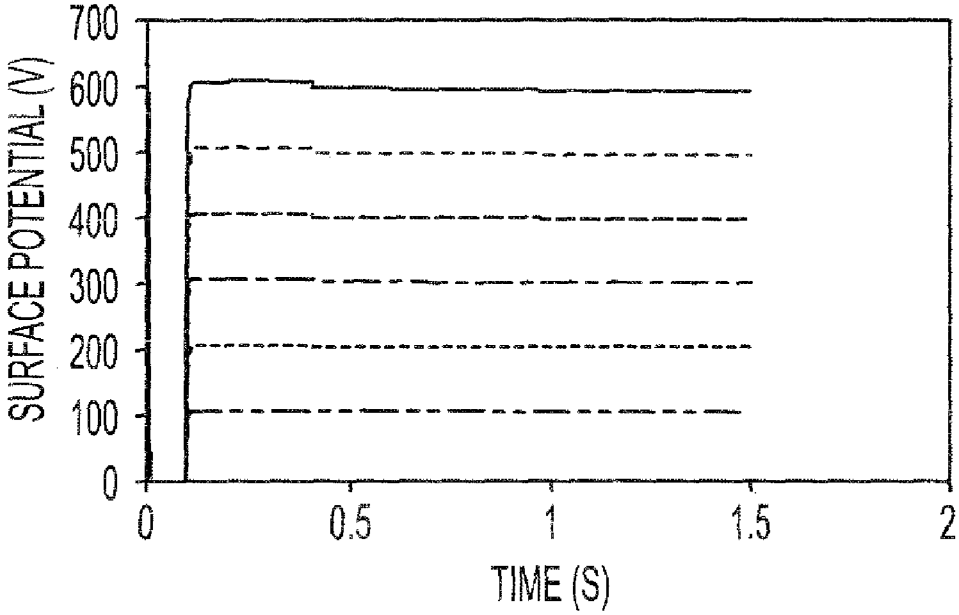

FIG. 6A shows charge-discharge curve of a CNT bi-layer imaging member of Example 1, while FIG. 6B shows charge-discharge curve of a control bi-layer imaging member where the CNT film is replaced by a Ti/Zr metal layer. As shown in FIG. 6A, the CNT bi-layer imaging member charges capacitively. Unlike the control, the CNT bi-layer imaging member underwent rapid discharge as soon as the electric field across the bi-layer imaging members was established.

The initial discharge rate (dV/dt) of the CNT bi-layer imaging members was found to be sensitive to the surface resistivity of the carbon nanotube film. The PEDOT bi-layer imaging members were found to charge and discharge analogously. The results are summarized in Table 1.

TABLE 1

| Device | Hole injecting film | Surface resistivity of Hole injecting film (Ω/sq) | CTL thickness (μm) | dV/dt at E-field ~33 V/μm |
|---|---|---|---|---|
| A | CNT | ~100 | 18 | 68,780 |
| B | CNT | ~250 | 18 | 56,083 |
| C | CNT | ~1000 | 18 | 30,267 |
| D | CNT | ~2500 | 18 | 12,550 |
| E | PEDOT | ~350 | 23 | 75,562 |
| F | PEDOT | ~1500 | 23 | 54,735 |
| G | PEDOT | ~2500 | 21 | 31,333 |

Example 4

Printing Test of Bilayer Members Using an InkJet Printed Bi-Layer Imaging Member A PEDOT layer was patterned on a Mylar substrate by inkjet printing using a Dimatix inkjet printer model DMP2800 (FUJIFILM Dimatix, Inc., Santa Clara, Calif.). A charge transfer layer (CTL) of about 18 μm thick containing N,N'-diphenyl-N,N-bis(3-methyl phenyl)-1,1'-biphenyl-4, 4'-diamine (TPD) and PCZ200 (a polycarbonate) (TPD), was coated over the inkjet patterned PEDOT layer to form an inkjet printed PEDOT bi-layer imaging member. The inkjet printed PEDOT bi-layer imaging member was then pasted on a photoreceptor drum and grounded in a similar manner as described above in Example 2. The print test results demonstrated that PEDOT was easily patterned and printed. These patterned PEDOT pixels were coupled to a TFT matrix for then to serve as a digital printing device. The carbon nanotube imaging member was also patterned in a similar fashion.

Example 5

Direct Digital Printing

A 15 cm×15 cm piece of a PEDOT/TPD bi-layer imaging member of Example 2 was pasted on an OPC drum in the CRU. The surface resistivity of PEDOT was about 350 Ω/sq. The charge transfer layer containing N,N'-diphenyl-N,N-bis (3-methyl phenyl)-1,1'-biphenyl-4,4'-diamine (TPD) and PCZ200 (a polycarbonate) was draw bar coated on the PEDOT layer in the same manner as described in Example 2. The bilayer member was attached on the OPC drum by Kapton tape. The OPC drum was used to provide a support for the bilayer member and to provide the ground plane for the bilayer member to be electrically grounded. The bilayer member on the OPC drum was electrically grounded to the Al groundplane of the OPC drum by silver paste. Printing experiments were performed by mounting this CRU onto a bench DC8000 development fixture. The OPC drum was allowed to rotate at a speed of about 352 mm/s under a negatively biased, toned semiconducting magnetic brush (SCMB). Ultra-low melt EA Cyan toner was used for the printing experiment. Experimental results (not illustrated) show that after passing through the development nip, toner development was obtained on the bilayer member. Toner image was formed on the PEDOT nano-enabled imaging member without a PR, laser/ROS or a charger.

Figure 7:
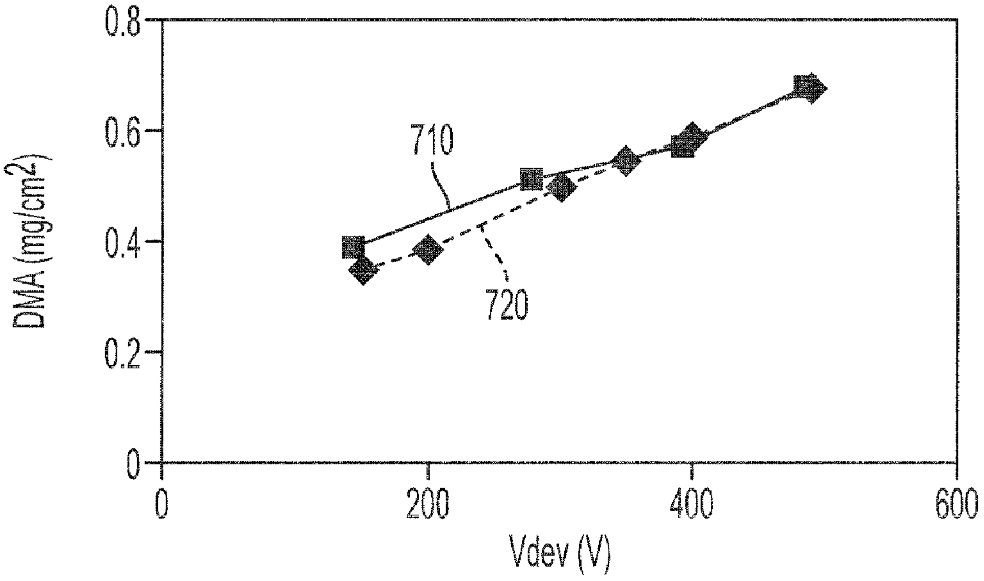
FIG. 7 compares direct printing results with and without the charger of the nano-enabled imaging member prior to the development in accordance with various embodiments of the present teachings.

FIG. 7 compares direct printing results on the same device with the charger (see curve 710) and without the charger (see curve 720) of the nano-enabled imaging member prior to the development. For example, the development curve results (development mass area vs. mag roll bias voltage) of FIG. 7 were given for PEDOT bilayer members on the DC8000 development fixture.

The similarity in development in both configurations of FIG. 7 indicates that the magnetic brush served a dual role in the direct printing mode. As the bilayer member first contacted the magnetic brush, the bias on the magnetic brush induced a hole injection reaction to create the electrostatic latent image on the CTL surface of the bilayer. This was followed by toner development before the bilayer member exited the development nip. This two step process was accomplished within the development nip, resulting in direct toner printing without laser/ROS, charger or PR as illustrated in FIG. 2.

The observed direct printing processes can simplify the generation of electrostatic images as compared to xerography. Furthermore, the above described direct printing process can be digitized by coupling the printing process with a TFT backplane, for example.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms “including,” “includes,” “having,” “has,” “with,” or variants thereof are used in either the detailed description and the claims, such terms are intended to be inclusive in a manner similar to the term “comprising.”

Further, in the discussion and claims herein, the term “about” indicates that the value listed may be somewhat altered, as long as the alteration does not result in nonconformance of the process or structure to the illustrated embodiment. Finally, “exemplary” indicates the description is used as an example, rather than implying that it is an ideal.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. A direct digital making method comprising:

providing a nano-enabled imaging member, the nano-enabled imaging member comprising an array of hole-injecting pixels disposed over a substrate and a charge transport layer disposed over the array of hole-injecting pixels, wherein each pixel of the array of hole-injecting pixels is electrically isolated and individually addressable;

providing a negatively-biased development subsystem in proximity to the nano-enabled imaging member to form a development nip there-between;

generating a surface charge contrast at the development nip on a surface of the charge transport layer by selectively addressing one or more pixels of the array of hole-injecting pixels, wherein the one or more selectively addressed pixels inject holes at the interface of each of the one or more pixels and the charge transport layer and the charge transport layer transports the holes to the surface;

developing the surface charge contrast with a developing material at the development nip to form a developed image on the surface of the charge transport layer; and transferring the developed image from the charge transport layer onto a media.

2. The method of claim 1, wherein the nano-enabled imaging member further comprises an array of thin film transistors disposed over the substrate, such that each thin film transistor is connected to one pixel of the array of hole-injecting pixels.

3. The method of claim 2, wherein the step of generating a surface charge contrast at the development nip further comprises applying an electrical bias to the one or more pixels of the array of hole-injecting pixels via thin film transistors to either enable hole injection or disable hole injection at the interface of each of the one or more pixels and the charge transport layer.

4. The method of claim 1, wherein each pixel of the array of hole-injecting pixels comprises one or more of a nano-carbon material and a conjugated polymer.

5. The method of claim 4, wherein the nano-carbon material comprises one or more of a single-wall carbon nanotube, a double-wall carbon nanotube, a multi-wall carbon nanotube, graphene and a mixture thereof.

6. The method of claim 4, wherein the conjugated polymer is selected from the group consisting of poly(3,4-ethylenedioxythiophene), alkyl substituted EDOT, phenyl substituted 3,4-ethylenedioxythiophene, dimethyl substituted polypropylenedioxythiophene, cyanobiphenyl substituted 3,4-ethylenedioxythiopene, teradecyl substituted poly(3,4-ethylenedioxythiophene), dibenzyl substituted poly(3,4-ethylenedioxythiophene), sulfonate substituted poly(3,4-ethylenedioxythiophene), dendron substituted poly(3,4-ethylenedioxythiophene), a complex of poly(3,4-ethylenedioxythiophene)-polystyrene sulfonic acid, and a mixture thereof.

7. The method of claim 1, wherein the charge transport layer comprises a charge transporting small molecule dispersed in an electrically inert polymer, wherein the charge transporting small molecule is selected from the group consisting of pyrazoline, diamine, hydrazone, oxadiazole, stilbene, aryl amine, N,N'-diphenyl-N,N'-bis(alkylphenyl)-1,1'-biphenyl-4,4'-diamine with alkyl selected from the group consisting of methyl, ethyl, propyl, butyl, hexyl, and a mixture thereof; N,N'-diphenyl-N,N'-bis(chlorophenyl)-1,1'-biphenyl-4,4'-diamine; N,N'-bis(4-butylphenyl)-N,N'-di-p-tolyl-[p-terphenyl]-4,4"-diamine; N,N'-bis(4-butylphenyl)-N,N'-di-m-tolyl-[p-terphenyl]-4,4"-diamine; N,N'-bis(4-butylphenyl)-N,N'-di-o-tolyl-[p-terphenyl]-4,4"-diamine; N,N'-bis(4-butylphenyl)-N,N'-bis-(4-isopropylphenyl)-[p-terphenyl]-4,4"-diamine; N,N'-bis(4-butylphenyl)-N,N'-bis-(2-ethyl-6-methylphenyl)-[p-terphenyl]-4,4"-diamine; N,N'-bis(4-butylphenyl)-N,N'-bis-(2,5-dimethylphenyl)-[p-terphenyl]-4,4'-diamine; N,N'-diphenyl-N,N'-bis(3-chlorophenyl)-[p-terphenyl]-4,4"-diamine; and a mixture thereof.

8. The method of claim 7, wherein the electrically inert polymer is selected from the group consisting of polycarbonate, polyarylate, polystyrene, acrylate polymer, vinyl polymer, cellulose polymer, polyester, polysiloxane, polyimide, polyurethane, poly(cyclo olefin), polysulfone, and epoxy, and random or alternating copolymers thereof.

9. The method of claim 1, wherein the developing material comprises one or more of powder toner, liquid toner, hydrocarbon based liquid ink, flexo ink, or offset ink.

10. A direct digital marking system comprising:

a nano-enabled imaging member for forming an electrostatic latent image, the nano-enabled imaging member comprising an array of hole-injecting pixels disposed over a substrate and a charge transport layer disposed over the array of hole-injecting pixels, wherein each pixel of the array of hole-injecting pixels is electrically isolated and individually addressable;

a negatively-biased development subsystem in proximity to the nano-enabled imaging member, such that the negatively-biased development subsystem and the nano-enabled imaging member form a development nip for developing the electrostatic latent image and forming a developed image; and a transfer subsystem for transferring the developed image onto a media.

11. The system of claim 10, wherein the nano-enabled imaging member further comprises an array of thin film transistors disposed over the substrate, such that each thin film transistor is connected to one pixel of the array of hole-injecting pixels.

12. The system of claim 10, wherein the each pixel of the array of hole-injecting pixels comprises one or more of a nano-carbon material and a conjugated polymer;

wherein the nano-carbon material comprises one or more of a single-wall carbon nanotube, a double-wall carbon nanotube, a multi-wall carbon nanotube, graphene and a mixture thereof; and wherein the conjugated polymer is selected from the group consisting of poly(3,4-ethylenedioxythiophene), alkyl substituted EDOT, phenyl substituted 3,4-ethylenedioxythiophene, dimethyl substituted polypropylenedioxythiophene, cyanobiphenyl substituted 3,4-ethylenedioxythiopene, teradecyl substituted poly(3,4-ethylenedioxythiophene), dibenzyl substituted poly(3,4-ethylenedioxythiophene), sulfonate substituted poly(3,4-ethylenedioxythiophene), dendron substituted poly(3,4-ethylenedioxythiophene), a complex of poly(3,4-ethylenedioxythiophene)-polystyrene sulfonic acid, and a mixture thereof.

13. The system of claim 10, wherein the charge transport layer comprises a charge transporting small molecule dispersed in an electrically inert polymer, wherein the charge transporting small molecule is selected from the group consisting of N,N'-diphenyl-N,N'-bis(alkylphenyl)-1,1'-biphenyl-4,4'-diamine with alkyl selected from the group consisting of methyl, ethyl, propyl, butyl, hexyl, and a mixture thereof; N,N'-diphenyl-N,N'-bis(chlorphenyl)-1,1'-biphenyl-4,4'-diamine; N,N'-bis(4-butylphenyl)-N,N'-di-p-tolyl-[p-terphenyl]-4,4"-diamine; N,N'-bis(4-butylphenyl)-N,N'-di-m-tolyl-[p-terphenyl]-4,4"-diamine; N,N'-bis(4-butylphenyl)-N,N'-di-o-tolyl-[p-terphenyl]-4,4"-diamine; N,N'-bis(4-butylphenyl)-N,N'-bis-(4-isopropylphenyl)-[p-terphenyl]-4,4"-diamine; N,N'-bis(4-butylphenyl)-N,N'-bis-(2-ethyl-6-methylphenyl)-[p-terphenyl]-4,4"-diamine; N,N'-bis(4-butylphenyl)-N,N'-bis-(2,5-dimethylphenyl)-[p-terphenyl]-4,4'-diamine; N,N'-diphenyl-N,N'-bis(3-chlorophenyl)-[p-terphenyl]-4,4"-diamine; and a mixture thereof, and wherein the electrically inert polymer is selected from the group consisting of polycarbonate, polystyrene, polyarylate, acrylate polymer, vinyl polymer, cellulose polymer, polyester, polysiloxane, polyimide, polyurethane, poly(cyclo olefin), polysulfone, and epoxy, and random or alternating copolymers thereof.

14. The system of claim 10, wherein the negatively-biased development subsystem comprises at least one of a magnetic brush, a donor roll, and a bias transfer roll.

15. The system of claim 10, wherein the charge transport layer of the nano-enabled imaging member has a thickness ranging from about 5 μm to about 45 μm.

16. The system of claim 10, wherein each hole-injecting pixel has a surface resistivity ranging from about 10 ohm/sq. to about 5,000 ohm/sq.

17. A method of printing an image onto a media comprising:

providing a nano-enabled imaging member, the nano-enabled imaging member comprising an array of hole-injecting pixels disposed over a substrate and a charge transport layer disposed over the array of hole-injecting pixels, wherein each pixel of the array of hole-injecting pixels is electrically isolated and individually addressable;

providing a negatively-biased development subsystem comprising a magnetic brush such that the provided negatively-biased development subsystem forms a development nip with the nano-enabled imaging member;

generating an electrostatic latent image at the development nip on a surface of the charge transport layer by selectively addressing one or more pixels of the array of hole-injecting pixels via the magnetic brush, wherein the one or more selectively addressed pixels inject holes at the interface of each of the one or more pixels and the charge transport layer and the charge transport layer transports the holes to the surface;

developing the electrostatic latent image with a developing material at the development nip to form a developed visible image on the surface of the charge transport layer; and transferring the developed visible image from the charge transport layer onto a media.

18. The method of claim 17, wherein each hole-injecting pixel has a surface resistivity ranging from about 10 ohm/sq. to about 5,000 ohm/sq.

19. The method of claim 17, wherein the developing material is selected from the group consisting of powder toner, liquid toner, hydrocarbon based liquid ink, flexo ink, offset ink, and a mixture thereof.

20. The method of claim 17, wherein the charge transport layer of the nano-enabled imaging member has a thickness ranging from about 5 μm to about 45 μm.

* * * * *